United States Patent
Moy et al.

[11] Patent Number: 5,973,327
[45] Date of Patent: Oct. 26, 1999

[54] IMAGE DETECTOR WITH IMPROVED CONTRAST

[75] Inventors: Jean-Pierre Moy, St Egreve; Thierry Docourant, Voiron, both of France

[73] Assignee: Thomson Tubes Electroniques, Meudon La Foret, France

[21] Appl. No.: 08/997,733

[22] Filed: Dec. 24, 1997

[30] Foreign Application Priority Data

Dec. 27, 1996 [FR] France .................................. 96 16110

[51] Int. Cl.$^6$ .................................................. G01T 1/20
[52] U.S. Cl. ............................... 250/370.09; 250/370.06; 250/370.08; 250/369
[58] Field of Search ........................ 250/370.09, 370.08, 250/370.06, 369

[56] References Cited

U.S. PATENT DOCUMENTS

| | | |
|---|---|---|
| 4,682,018 | 7/1987 | Moy . |
| 4,724,323 | 2/1988 | Fukaya et al. ........................ 250/370.08 |
| 4,743,751 | 5/1988 | Arques et al. . |
| 4,980,553 | 12/1990 | Henry . |
| 5,036,203 | 7/1991 | Solomon . |
| 5,157,258 | 10/1992 | Gunning, III et al. ............ 250/370.06 |
| 5,294,288 | 3/1994 | Melpolder et al. . |
| 5,422,489 | 6/1995 | Bhargava . |
| 5,548,123 | 8/1996 | Perez-Mendez et al. .......... 250/370.09 |

FOREIGN PATENT DOCUMENTS 44 33 132   3/1996   Germany .

*Primary Examiner*—Constantine Hannaher
*Assistant Examiner*—Andrew Israel
*Attorney, Agent, or Firm*—Oblon, Spivak, McClelland, Maier & Neustadt, P.C.

[57] ABSTRACT

Disclosed is an image detector of the type comprising an array of photosensitive dots and an additional light source. The disclosed device can be applied to particular advantage in the detection of radiological images. The image detector comprises a photosensitive matrix and an additional source positioned on opposite faces of a support. The matrix is exposed to a radiation known as an incident radiation, a part of which is not detected by the matrix. The detector furthermore comprises means to promote the transmission of an additional radiation produced by the additional source with respect to the undetected part of the incident radiation. An arrangement of this kind enables an improvement in the contrast of the image, especially at the low spatial frequencies.

19 Claims, 1 Drawing Sheet

IMAGE DETECTOR WITH IMPROVED CONTRAST

BACKGROUND OF THE INVENTION

1. Field of the Invention

The present invention relates to image detectors the type in which a matrix of photosensitive elements is associated with an additional light source. The invention can be applied in an especially promising manner to the detection of radiological images.

At present, it is usual to find large-sized image detector panels using matrices of photosensitive dots made of semiconductor materials, manufactured in particular by the technique of thin-film deposition. Most frequently, the photosensitive dots consist of amorphous silicon. Each of them comprises a photosensitive element (a photodiode for example) associated with a switch element constituted by a transistor or by a so-called switching diode.

The photosensitive dots form an array of rows and columns. The line-by-line activation of each of the switching elements enables the transfer, to a column, of the charges produced by the corresponding photodiode during the exposure of this photodiode to a measurement light signal, namely to a signal corresponding to an image to be detected. External multiplexer circuits are then used to read the charges of the different photosensitive dots.

2. Description of the Prior Art

A photosensitive matrix of the type indicated here above as well as its mode of operation and a way of making it are described in particular in the French patent application No. 86.14.048 (publication No. 2.605.166).

For the detection of radiological images, it is enough to interpose a scintillator between the photosensitive matrix and the X-rays in order to convert the X-rays into visible radiation or near-visible radiation to which the photodiodes are sensitive. It is the conventional practice, to this end, to coat the photosensitive elements of the matrix with a layer of a scintillating substance such as thallium-doped cesium iodide.

There are different methods of controlling the operation of the photosensitive matrices. These methods depend especially on the particular goals that are aimed at, the general organization of the matrix as well as the constitution of the photosensitive dots.

Some of these methods of control use an additional illumination of the photosensitive dots by means of an additional light source. This additional light source produces an additional light beam (hereinafter called an additional radiation) that is independent of the measurement light signal corresponding to an image to be detected. This case is fairly frequent, especially when the photosensitive dots are each constituted by a photodiode that is series-connected with a switching diode. Indeed, in this case, the exposure of the photosensitive dots to additional radiation is a relatively simple means of taking action on the value of a voltage present at the junction point of the photodiode and a switching diode, in each of the photosensitive dots.

This exposure of the photosensitive dots to additional radiation may constitute what is called an optical resetting or optical level-resetting operation. It is generally performed in a stage of the method that precedes the stage of exposure to the useful measurement signal. An optical resetting operation of this kind is described in the patent application No. 86.14.058 already mentioned here above.

Other methods of operation are known wherein an additional illumination of the photosensitive matrix is accomplished in order to create so-called drive charges in each of the photosensitive dots. A method of operation of this kind is described in the French patent application No. 88.12126 published under No. 2.636.800. In this operation, for each photosensitive dot, driving charges are added to the "signal" charges produced by the measurement light signal in order to improve the efficiency of transfer of these charges for the low values of the signal.

Whatever the reasons for exposing the photosensitive matrix to additional radiation, the additional light source (hereinafter called a "additional source") which produces this radiation is generally positioned on a rear face of the support of the photosensitive matrix, namely on a face opposite the one on which the matrix is made. An arrangement of this kind is made possible through the transparency of the support which is generally made of glass. Consequently, the level of transparency of the support is of great importance because the higher this level of transparency the greater is the degree to which, for the same result, it enables the emission of the additional radiation with lower power and hence provides for the greater compactness and lower cost of the additional radiation source.

However, this transparency of the support which is useful for additional illumination may also have a major drawback which is explained in greater detail with reference to FIG. 1.

FIG. 1 gives a schematic view of a cross-section (parallel to a line of photosensitive dots for example) of the structure of a standard image detector panel 1 of the type defined here above. The image detector has a matrix 2 of photosensitive dots p1, p2, p3 each formed in the example by a switching diode Dc associated with a photodiode Dp. The photosensitive matrix 2 is made on a first face 3 of a transparent support or substrate 4, made of glass for example. The image detector 1 furthermore has an additional source 6 applied to the second face or rear face 7 of the support 4 opposite the photosensitive matrix 2. The additional source 6 (using for example photoemissive diodes that are not shown) produces a radiation constituting the additional radiation mentioned here above, designed for example to obtain an optical resetting operation.

The photosensitive matrix 2 is illuminated by a so-called incident radiation represented by rays Ri. This radiation is the measurement light signal. The incident light to be detected is generally not entirely absorbed by the photosensitive dots p1, p2, p3. Indeed, a small part of the incident radiation Ri goes through the active material of these photosensitive dots (the amorphous silicon of the photodiodes Dp) without being absorbed. Another part goes through the detector panel 1 between the photodiodes in the free spaces between connections (not shown).

After the crossing of the glass substrate 4, as indicated in FIG. 1 by the paths tr1, tr2, . . . , trn, this fraction of incident light which has not been absorbed and therefore not detected is reflected or scattered uncontrollably. This light fraction then constitutes a parasitic light which may finally be detected by photosensitive dots other than the dots close to which it has passed or in which it has passed and more particularly through dots which are distant from it. The additional source 6 is shown as being applied against the substrate 4. It is possible to envisage an embodiment in which the additional source 6 and the substrate 4 are separated by a free space. Its thickness may be one or more millimeters or even one or more centimeters. This space forms a substrate-air diopter with the substrate. Light can be propagated in this space.

The overall result is a loss of contrast that is particularly pronounced at the low spatial frequencies.

One solution aimed at reducing the level of this parasitic light, drawing inspiration from techniques used in the field of image intensifiers, consists of the use of a less transparent support having a transmission T. In this case, the undetected light must go twice through the support in order to be picked up by a photosensitive dot and it is therefore attenuated by a factor $T^2$. It is thus possible to make the parasitic light negligible. This approach has the drawback by which, in particular, the additional radiation must be 1/T times more powerful in order to fulfil its function.

It is an aim of the present invention to reduce the loss of contrast mentioned here above without in any way thereby having to modify the emitted power of the additional radiation.

SUMMARY OF THE INVENTION

According to the invention, there is proposed an image detector comprising a matrix of photosensitive dots, a support on which the photosensitive matrix is made, a source known as an additional source producing an additional radiation, the additional source being positioned on the side corresponding to a face of the support opposite a face that bears the photosensitive matrix, the photosensitive matrix being exposed to a radiation known as an incident radiation, a part of the incident radiation being not detected by the photosensitive matrix, wherein said detector further comprises means to promote the transmission of the additional radiation between the additional source and the photosensitive matrix with respect to the undetected part of the incident radiation.

BRIEF DESCRIPTION OF THE DRAWINGS

The invention will be understood more clearly and other advantages shall appear from the following description of certain of these embodiments, this description being made by way of a non-restrictive example with reference to the appended drawings, of which.

MORE DETAILED DESCRIPTION

Figure 1:
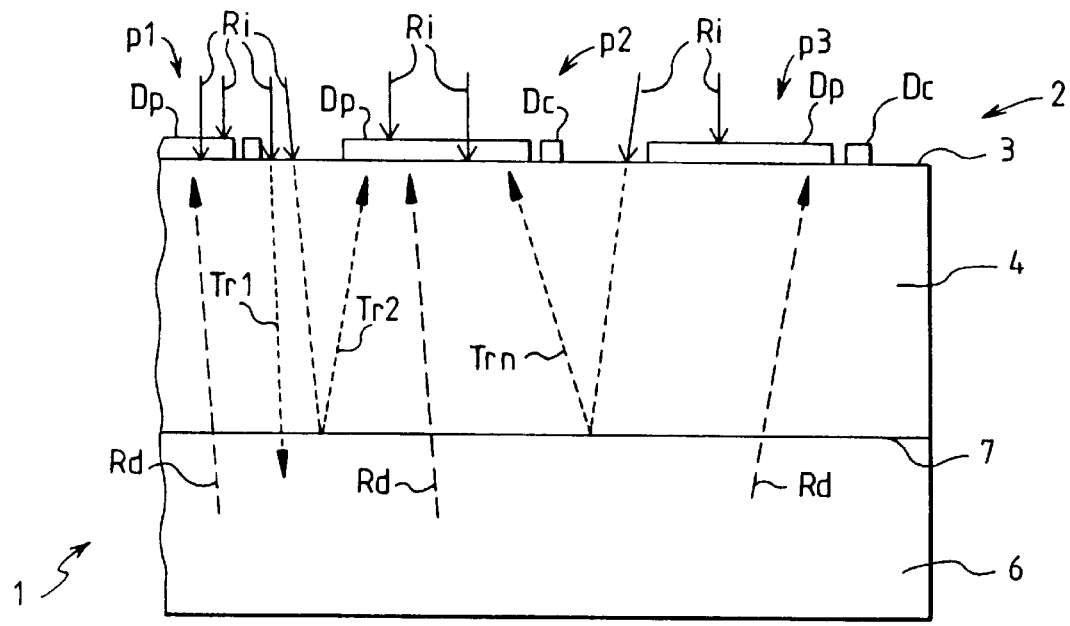
FIG. 1 already described represents a standard image detector structure.
Figure 2:
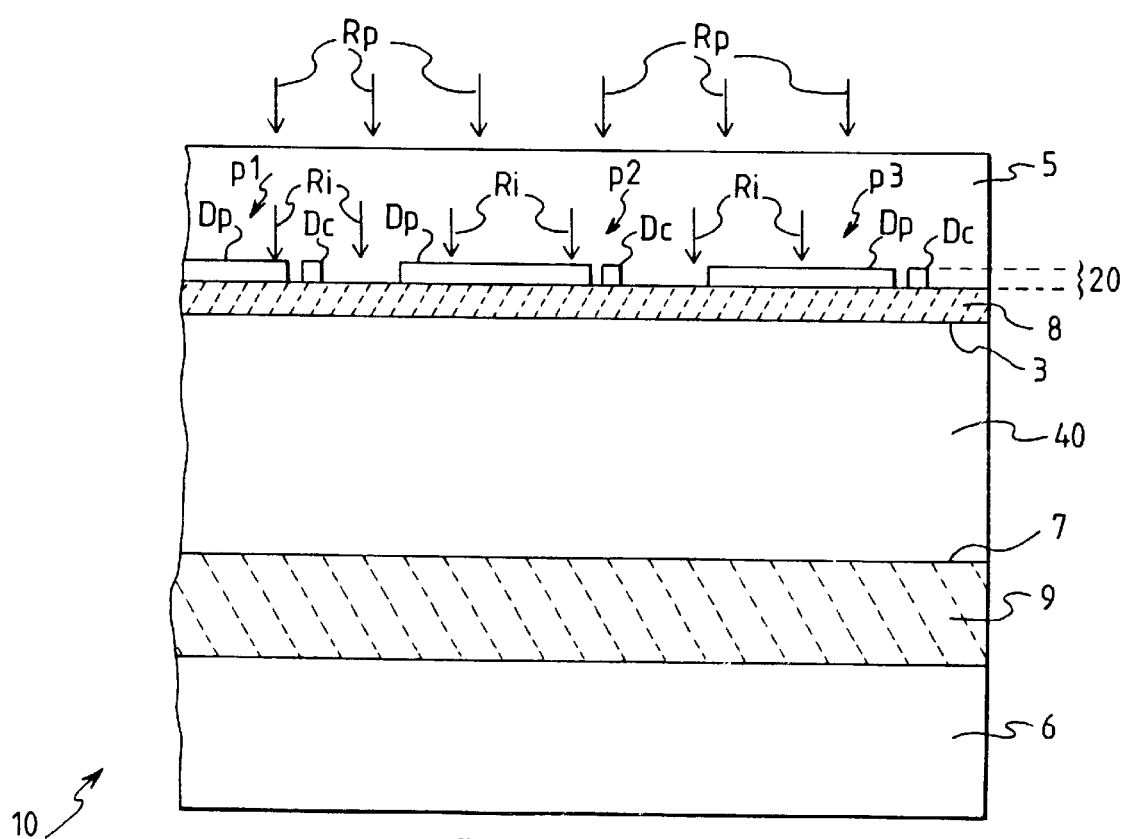
FIG. 2 shows the structure of an image detector according to the invention.

FIG. 2 shows the structure of an image detector 10 according to the invention in a cross-section similar to that of FIG. 1. The detector 10 has a matrix 20 of photosensitive dots p1, p2, p3 of the same type as those of the matrix 2 shown in FIG. 1. As in the case of FIG. 1, the matrix 20 is made on the face 3 of a support 40. The detector 10 has an additional source 6 on the side corresponding to its rear face 7. This additional source may be for example of the same type as that of FIG. 1. A free space herein may also separate the substrate 40 from the additional source 6. The additional source 6 is designed to produce additional radiation Rd (not shown in FIG. 2) in order to carry out an optical resetting operation.

In the example shown, since the detector 10 is designed for the detection of radiological images, it furthermore comprises, as compared with the detector 1 of the FIG. 1, a scintillator constituted by a layer 5 covering the matrix 20 and therefore the photosensitive dots p1, p2, p3. The scintillator 5 receives a primary radiation Rp, namely an X-radiation in the example, that it converts into an incident radiation Ri illuminating the photosensitive matrix 20 and corresponding to a band of wavelengths to which the photodiodes Dp are sensitive.

According to one characteristic of the invention, the scintillating substance of the scintillator 5 and/or the additional source 6 are chosen so that the emission of the incident radiation Ri by the scintillator 5 and the emission of an additional radiation Rd by the additional source 6 are done at different wavelengths or more specifically correspond to different bands of wavelengths.

According to another characteristic of the invention, this difference in bands of wavelengths is combined with a wavelength-selective element making it possible to promote the transmission of the additional radiation Rd with respect to a part (not shown in FIG. 2) of the incident light Ri not detected by the photosensitive matrix 20.

Thus, for example, in this first version of the invention, firstly with the scintillator 5 made of thallium-doped cesium iodide, the X-radiation or primary radiation Rp is converted into visible light, mainly in the green region, centered on 550 nanometers and, secondly, the optical resetting can be done advantageously in red light and the additional radiation Rd may therefore be centered on about 650 nanometers. Indeed, amorphous silicon is sensitive to these wavelengths and is more transparent, thus enabling an efficient resetting operation throughout its thickness. Furthermore, there exist efficient and low-cost red photoemissive diodes.

As for the wavelength-selective transmission element, it may be constituted in different ways some of which are described here below.

The wavelength-selective transmission element may be constituted by the support 40 itself. Indeed, the support 40 can be made absorbent, in the green region of the spectrum for example, with high transmission in the red region, for example by simply dyeing its constituent glass red. In this case, the undetected part of the incident radiation Ri is absorbed by the support 40 and can therefore no longer reach other photosensitive dots.

It must be noted that a result of this kind is also obtained for incident and additional radiation Ri, Rd having different wavelengths provided that the support 40 is dyed to correspond substantially to the central wavelength of the additional radiation. For example, for an incident radiation Ri centered (unlike the first example) on about 650 rm and an additional radiation Rd centered on 550 nm, the medium 40 would have to be dyed green.

In another embodiment, the wavelength-selective transmission element is constituted by a dichroic layer 8 of the multidielectric type for example, firstly to transmit wavelengths that correspond to the additional radiation Rd and secondly to reflect the undetected part of the incident radiation Ri. This means that, in the case of the first example indicated here above, this dichroic layer 8 is transparent at 650 nm and reflected at 550 nm. The dichroic layer 8 is located between the matrix 20 and the support 40 on which it is deposited before the matrix 20.

It must be noted that the approach presented here above, although it may be rather expensive at the manufacturing stage, has the advantage of increasing the efficiency of detection of the photodiodes Dp.

Finally, in an embodiment that is advantageous for industrial-scale application, the wavelength-selective transmission element is a dyed layer 9 positioned between the support 40 and the additional source 6.

The dyed layer 9 has the function of absorbing the undetected part of the incident radiation Ri (after it has gone through the support 40) and of transmitting the additional radiation Rd produced by the additional source 6. To this end, in the case of the first example referred to here above, the dyed layer 9 is absorbent at about 550 nm and transparent at about 650 nm (i.e. it is dyed red).

The dyed layer 9 must be made of a material with a refraction index as close as possible to that of the support 40. To this end, this layer 9 may for example be a glaze or else a polymer sheet bonded to or laminated on the rear face 7 of the support 40. The layer 9 may also consist of a plate of dyed glass. The bonder should also be chosen with a refraction index close to that of the support 40, made out of glass for example, or else this index should have a value in between those of the indices shown by the support 40 and by the material forming the dyed layer.

The matching of the indices is aimed at avoiding reflections on the diopter formed at the interface 9-40 between the dyed layer 9 and the support 40. However, this matching is not critical: indeed, a difference in index of 0.1 (for example 1.4 and 1.5) results in a reflection coefficient of 0.001 at normal incidence.

The embodiment of the invention using the dyed layer 9 is valuable for manufacture on an industrial scale in that it does not disturb the making of the detective panel 10 which, in particular, requires corrosive thermal and chemical treatment. It is relatively inexpensive and easily lends itself to manufacture in large quantities.

Of course, it is also possible to make simultaneous use of the different embodiments of the wavelength-selective transmission element 40, 8, 9. This selective transmission element 40, 8, 9 is in fact a wavelength-selective filter which, firstly, in all three cases, must transmit the additional radiation Rd with the lowest possible attenuation and, secondly, must absorb the incident radiation Ri to the maximum degree except in the version of the transmission element 8 (dichroic layer) where this incident radiation is reflected. There is therefore no incompatibility between the three wavelength-selective transmission elements.

The above explanations relate to the case in which the wavelengths of the incident radiation Ri and those of the additional radiation Rd are different and are contained in bands that are at a relative distance from each other.

However, the invention can be applied in different configurations. It can be applied advantageously even when the incident radiation Ri and the additional radiation Rd have wavelength bands centered on one and the same wavelength provided that the wavelength band of the additional radiation is narrower than that of the incident radiation Ri.

In such a case, the part of the incident radiation Ri capable of being transmitted by the wavelength-selective transmission element 40, 8, 9 constitutes only a small fraction of the undetected part of the incident radiation Ri. This fraction may be all the smaller as, in such a case, the additional source 6 may be of a type comprising elements that are standard per se, capable of producing the additional radiation Rd in a very narrow wavelength band. Consequently, it is possible to use wavelength-selective transmission elements that promote the transmission of a wavelength band which is itself very narrow. Using for example a selective transmission element of the dichroic layer 8 type, it is possible to limit this transmission to a particularly narrow band.

In the non-restrictive example shown in FIG. 2, the image detector 10 has a scintillator 5 enabling it to convert the primary radiation Rp into a light radiation forming the incident radiation Ri adapted to the sensitivity of the photosensitive matrix 20 (the primary radiation Rp being an X-radiation as indicated further above). It must be noted firstly that the scintillator 5 may be of different types (cesium iodide, gadolinium oxide, etc.) and secondly that the primary radiation Rp too may be of different types, for example gamma radiation, neutron radiation, etc.

It must furthermore be observed that the primary radiation may also have wavelengths in the wavelength band of sensitivity of the matrix 20. In this case, it directly forms the incident radiation Ri and the scintillator 5 is not necessary.

The invention can be applied also advantageously when the primary radiation directly forms the incident radiation Ri, i.e. when there is no scintillator 5. In such a case, indeed, assuming that the incident radiation Ri, Rp by which the photosensitive matrix 20 is illuminated occurs in a wavelength band corresponding to visible light, the additional radiation Rd used for the optical resetting operation may be constituted by wavelengths contained in the visible light band but forming a far narrower band than this visible light band. Under these conditions, the wavelength-selective transmission element 40, 8, 9, according to its function, transmits the additional radiation Rd plus a light corresponding to a fraction of the part of the incident radiation Ri that is not detected (by the photosensitive matrix 20). This fraction is all the smaller as the transmission band of the selective element 40, 8, 9 is narrow and as the wavelength band of the incident radiation Ri is wide.

Naturally, in this configuration, where the primary radiation Rp directly constitutes the incident radiation Ri, the invention can be applied advantageously also, as in the version with the scintillator, to the case in which the wavelengths of the additional radiation Rd do not coincide, or coincide little, with the wavelengths of the incident radiation Ri. For example, the wavelength band of the additional radiation Rd may be located in the near infrared region to which the photosensitive dots p1, p2, p3 made out of semiconductor material, amorphous silicon for example, are sensitive. It must be noted that the wavelength band of the additional radiation Rd may be located also at the opposite end of the spectrum, namely in the ultraviolet region.

What is claimed is:

1. An image detector comprising:

a matrix of photosensitive dots exposed to an incident radiation, wherein said matrix of photosensitive dots is positioned on a support, an additional source producing an additional radiation, the additional source being positioned on a first face of the support wherein said first face is opposite a second face that bears the photosensitive matrix, wherein a part of said incident radiation is not detected by the photosensitive matrix, and wherein said detector further comprises means for both promoting transmission of the additional radiation from the additional source to the photosensitive matrix and for inhibiting the transmission of the undetected part of the incident radiation from the support towards the photosensitive matrix.

2. An image detector according to claim 1, wherein the incident radiation and the additional radiation correspond to different bands of wavelengths.

3. An image detector according to claim 1, wherein the incident radiation and the additional radiation are respectively emitted in a first and second band of wavelengths and wherein the two bands are centered on different wavelengths.

4. An image detector according to claim 1, wherein, the incident radiation and the additional radiation are respectively emitted in a first and second band of wavelengths and wherein the first band is centered on a wavelength included in the second wavelength band.

5. An image detector according to claim 1, wherein the additional radiation is emitted in a band of wavelengths that is narrower than the band of wavelengths of the incident radiation.

6. An image detector according to claim 1, comprising at least one wavelength-selective transmission element used to promote the transmission of the additional radiation.

7. An image detector according to claim 6, wherein the wavelength-selective transmission element is constituted by a dyeing of the support.

8. An image detector according to claim 7, wherein the dyeing of the support corresponds substantially to a central wavelength of the additional radiation.

9. An image detector according to claim 6, wherein the wavelength-selective transmission element is constituted by a dichroic layer that is transparent for the wavelengths corresponding to the additional radiation and reflective for at least the wavelengths corresponding to the incident radiation.

10. An image detector according to claim 9, wherein the dichroic layer is a layer of the multidielectric type.

11. An image detector according to claim 6, wherein the wavelength-selective transmission element is positioned between the photosensitive matrix and the support.

12. An image detector according to claim 6, wherein the wavelength-selective transmission element is constituted by a dyed layer positioned between the support and the additional source, the dyeing of said dyed layer corresponding substantially to the central wavelength of the additional radiation.

13. An image detector according to claim 12, wherein the dyed layer is constituted by a glaze.

14. An image detector according to claim 12, wherein the dyed layer is constituted by a polymer sheet.

15. An image detector according to claim 12, wherein the dyed layer is constituted by a glass plate.

16. An image detector according to claim 1 comprising, with a view to an application in radiology, a scintillator to convert an X-radiation (or gamma, neutron or other radiation) into a radiation known as an incident radiation in the band of wavelengths to which the photosensitive dots are sensitive.

17. An image detector according to claim 16, wherein the scintillator is thallium-doped cesium diode and wherein the additional radiation occurs in a band of wavelengths substantially centered on 650 nanometers.

18. An image detector according to claim 1, wherein the photosensitive dots are made out of a semiconductor material.

19. An image detector according to claim 18, wherein the semiconductor material is amorphous silicon.

* * * * *

UNITED STATES PATENT AND TRADEMARK OFFICE
CERTIFICATE OF CORRECTION

PATENT NO. : 5,973,327
DATED : October 26, 1999
INVENTOR(S) : Jean-Pierre MOY et al.

It is certified that error appears in the above-identified patent and that said Letters Patent is hereby corrected as shown below:

On the title page, item [75], the 2nd Inventor's name is misspelled. It should be:

--Thierry Ducourant--

Signed and Sealed this

Second Day of January, 2001

Attest:

Attesting Officer

Q. TODD DICKINSON

Commissioner of Patents and Trademarks